United States Patent
Yu

(10) Patent No.: US 8,334,220 B2
(45) Date of Patent: Dec. 18, 2012

(54) METHOD OF SELECTIVELY FORMING A SILICON NITRIDE LAYER

(75) Inventor: Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 621 days.

(21) Appl. No.: 11/689,325

(22) Filed: Mar. 21, 2007

(65) Prior Publication Data

US 2008/0233690 A1  Sep. 25, 2008

(51) Int. Cl.
*H01L 21/31* (2006.01)
*H01L 21/469* (2006.01)

(52) U.S. Cl. ......... 438/769; 257/E21.301; 257/E21.302

(58) Field of Classification Search ............ 438/791, 438/591, 216; 257/E21.301, E21.302, 324, 257/411, 410, E21.18, E29.309
See application file for complete search history.

(56) References Cited

U.S. PATENT DOCUMENTS

| | | | | |
|---|---|---|---|---|
| 4,619,034 A * | 10/1986 | Janning | ............ | 438/158 |
| 5,464,792 A * | 11/1995 | Tseng et al. | ............ | 438/585 |
| 5,589,407 A * | 12/1996 | Meyyappan et al. | ............ | 438/766 |
| 5,747,882 A * | 5/1998 | Wang et al. | ............ | 257/768 |
| 5,872,376 A * | 2/1999 | Gardner et al. | ............ | 257/336 |
| 6,040,207 A * | 3/2000 | Gardner et al. | ............ | 438/216 |
| 6,087,229 A * | 7/2000 | Aronowitz et al. | ............ | 438/287 |
| 6,114,203 A * | 9/2000 | Ghidini et al. | ............ | 438/258 |
| 6,197,701 B1 * | 3/2001 | Shue et al. | ............ | 438/763 |
| 6,268,296 B1 * | 7/2001 | Misium et al. | ............ | 438/763 |
| 6,323,114 B1 * | 11/2001 | Hattangady et al. | ............ | 438/591 |
| 6,531,364 B1 * | 3/2003 | Gardner et al. | ............ | 438/287 |
| 6,602,799 B2 | 8/2003 | Chen et al. | | |
| 6,706,581 B1 | 3/2004 | Hou et al. | | |
| 6,737,361 B2 | 5/2004 | Yoo | | |
| 6,756,647 B2 * | 6/2004 | Inoue et al. | ............ | 257/411 |
| 7,018,879 B2 | 3/2006 | Wang et al. | | |
| 7,045,432 B2 * | 5/2006 | Orlowski et al. | ............ | 438/300 |
| 7,531,411 B2 * | 5/2009 | Lu et al. | ............ | 438/264 |

(Continued)

OTHER PUBLICATIONS

Chen, C-C., et al. "Remote Plasma-Enhanced Atomic Layer Deposition (RPEALD) Nitride/Oxide Gate Dielectric for Sub-65nm Low Standby Power CMOS Application," Advanced Module Technology Division, Research & Development, Taiwan Semiconductor Manufacturing Co. Ltd., 2 pgs, Jun. 2003.

(Continued)

*Primary Examiner* — Matthew Landau
*Assistant Examiner* — Latanya N Crawford
(74) *Attorney, Agent, or Firm* — Slater & Matsil, L.L.P.

(57) ABSTRACT

A method for selectively forming a dielectric layer. An embodiment includes forming a dielectric layer, such as an oxide layer, on a semiconductor substrate, depositing a silicon layer on the dielectric layer, and treating the silicon layer with nitrogen, thereby converting the silicon layer into a silicon nitride layer. This method allows for a protective silicon nitride layer to be formed, while also preventing and/or reducing the nitrogen itself from penetrating far enough to contaminate the substrate. In another embodiment the treating with nitrogen is continued to form not only a silicon nitride, but to also diffuse a small portion of nitrogen into the dielectric layer to nitridized a portion of the dielectric layer. Optionally, an anneal could be performed to repair any damage that has been done by the treatment process.

17 Claims, 3 Drawing Sheets

U.S. PATENT DOCUMENTS

| | | | |
|---|---|---|---|
| 2003/0040171 A1* | 2/2003 | Weimer | 438/585 |
| 2005/0006696 A1* | 1/2005 | Noguchi et al. | 257/316 |
| 2006/0063391 A1* | 3/2006 | You et al. | 438/771 |
| 2006/0110865 A1* | 5/2006 | Liu et al. | 438/151 |
| 2006/0228907 A1* | 10/2006 | Cheng et al. | 438/792 |
| 2007/0018231 A1* | 1/2007 | Mitani et al. | 257/315 |
| 2008/0029790 A1* | 2/2008 | Ahn et al. | 257/288 |

OTHER PUBLICATIONS

Woerlee, P.H., et al., "$N_2O$ Nitrided Gate Dielectric Technology for 0.25 μm CMOS," 1993 VLSI Technology, Systems, and Applications, pp. 105-108, May 1993.

* cited by examiner

METHOD OF SELECTIVELY FORMING A SILICON NITRIDE LAYER

TECHNICAL FIELD

The present invention relates generally to semiconductor structures and methods, and more particularly to a method for selectively forming silicon nitride.

BACKGROUND

The scaling down of integrated circuits is a constant effort in order to increase the packing density and improve circuit performance. With circuits becoming smaller and faster, improving the device driving current becomes even more important. The device driving current in a metal-oxide-semiconductor (MOS) transistor is closely related to the gate's thickness, capacitance, and carrier mobility. Shortening the length of the gate, increasing the capacitance of the gate, and increasing the carrier mobility of the gate can all improve the transistor current performance. Accordingly, reducing the thickness of the gate dielectric is one of the ongoing efforts in order to shrink circuit size.

However, as the thickness of the gate dielectric is reduced, some factors, which were negligible in larger gate dielectrics, can become crucial to the proper functioning of the device. For example, in a gate dielectric with an ultra-thin gate oxide regime (where the thickness of the gate dielectric is less than or about 10 Å), the substrate/gate oxide interface, with its unwelcome electronic states and carrier traps, may dominate the electrical characteristics of the gate dielectric.

Also, in a thicker gate oxide, the thickness of the gate oxide serves to protect the substrate/gate oxide interface from unwanted dopants that might diffuse through the gate oxide contaminate the substrate/gate oxide interface. Thus, thinning the gate oxide in order to reduce the overall size also provides a smaller barrier, allowing more contamination. Excessive dopant diffused into the region near the substrate/gate oxide interface can affect the threshold voltage of the device and degrade its overall performance.

Solutions that have been used to resolve this problem either introduce nitrogen into the gate oxide or deposit a layer of silicon nitride onto the gate oxide. Introducing nitrogen into the gate oxide forms a nitridized silicon oxide layer (silicon oxynitride layer) that works as a barrier to a dopant attempting to diffuse into the semiconductor substrate. One approach to introducing nitrogen into the gate oxide is thermal nitridation of the gate oxide, where the gate silicon oxide is thermally treated in a nitrogen containing ambient such as ammonia ($NH_3$) to form a silicon oxynitride layer.

Unfortunately, while this nitridation process works well for thicker gate oxides, the nitrogen diffusion is very difficult to control, and the nitrogen itself can diffuse into the substrate. As a result, the substrate may be contaminated as shown in FIG. 2. This nitrogen near the substrate/gate oxide interface degrades the channel mobility of the device and leads to a degradation of the drive current. Furthermore, the silicon oxynitride layer has a higher dielectric constant than silicon oxide, which causes an increase in the device saturation current (Idsat). Accordingly, this is not an effective means to prevent contamination of the substrate/gate oxide interface for an ultra-thin gate dielectric.

The other option, depositing a layer of silicon nitride above the gate oxide, adversely effects the height of the gate. While the layer of silicon nitride acts as a barrier to contaminates, depositing silicon nitride by conventional techniques such as CVD and ALD forms a very thick dielectric layer (10 to 15 Å), which would cause the gate dielectric to be larger than desired.

Because of these and other problems associated with the current methods to prevent contamination in gate oxide regions, a new method to prevent the contamination into the substrate/gate oxide interface is needed, particularly for ultra-thin gate oxide layers.

SUMMARY OF THE INVENTION

These and other problems are generally solved or circumvented, and technical advantages are generally achieved, by embodiments of the present invention that allow for a shorter gate stack and corresponding reduction in size for the overall device, while forming a barrier to prevent excessive diffusion of contamination near the substrate/dielectric layer interface.

One aspect of the present invention involves a method for forming a silicon nitride layer that starts with forming a dielectric layer on a semiconductor substrate. A layer of silicon is then formed on the dielectric layer, and the silicon layer is treated with a material to transform it into a barrier layer that reduces the diffusion of dopants through the layer.

In another embodiment of the present invention, once the barrier layer has been formed, the treatment is continued and material is diffused into a portion of the dielectric layer. The barrier layer slows down the diffusion, allowing for better control of the diffusion into the dielectric layer, and helps to prevent and/or reduce the diffusion of material into the substrate. The diffusion process causes a portion of the dielectric layer to react and form another layer between the barrier layer and the dielectric layer.

Embodiments of the present invention can be used to form a metal-oxide semiconductor field effect transistor. This process begins with forming a dielectric layer on a semiconductor substrate. A silicon layer is then formed on the dielectric layer, and the silicon layer is treated with a material to transform the silicon layer into a barrier layer. A gate electrode, source and drain regions, and spacers are added to the formed gate stack to complete the MOSFET.

By creating this barrier layer with silicon that has been treated with a material such as nitrogen, the dielectric layer can be reduced while still preventing the diffusion of contaminants into the substrate/dielectric layer interface.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely, a method of selectively forming silicon nitride in an ultra-thin gate dielectric. The invention may also be applied, however, to forming other ultra-thin dielectric layers.

Figure 1A:
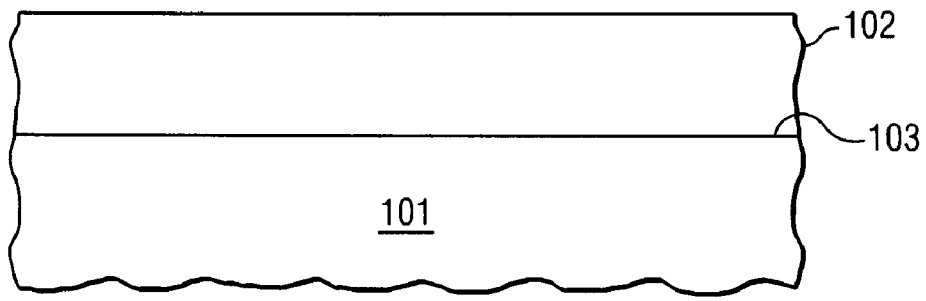
FIGS. 1A-1F are cross-sectional views of a wafer after various process steps are performed in accordance with an embodiment of the present invention.

With reference now to FIG. 1A, there is shown a substrate 101 used in the manufacture of semiconductor devices. The substrate 101 may comprise bulk silicon, doped or undoped, or an active layer of a silicon on insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Also shown in FIG. 1A, a dielectric layer 102 is deposited onto the substrate 101 to form the substrate/dielectric interface 103. The dielectric layer 102 is preferably an oxide layer grown to a thickness of about 4 Å to about 18 Å. The dielectric layer 102 may be formed, for example, by thermal growth, at a temperature of 600° C. to about 900° C., or by chemical vapor deposition (CVD) or atomic layer deposition (ALD) techniques using tetra-ethyl-ortho-silicate (TEOS) and oxygen as a precursor. Other processes and materials known in the art may be used. Other materials, such as silicon oxide, nitrogen-containing oxide, aluminum oxide, lanthanum oxide, hafnium oxide, zirconium oxide, hafnium oxynitride, strontium oxide, tantalum oxide, titanium oxide, hafnium silicate, hafnium aluminate, hafnium titanate, combinations thereof, or the like, may be used.

Figure 1B:
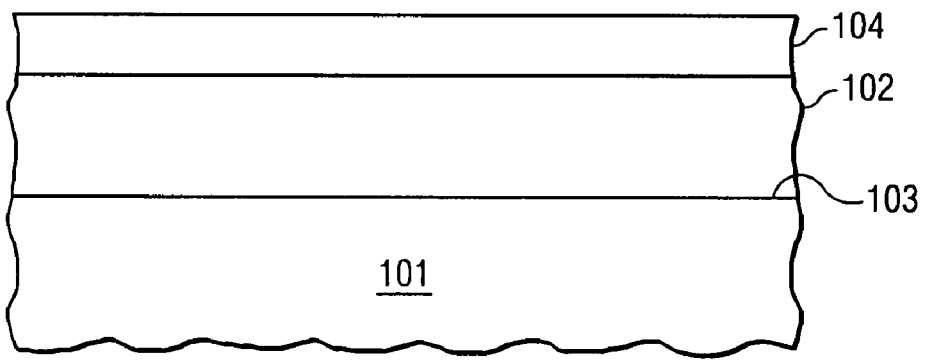

Next, as shown in FIG. 1B, a silicon layer 104 is deposited on the dielectric layer 102. The silicon layer 104 can be deposited by any method known in the art (such as physical vapor deposition (PVD) and CVD), but ALD is preferred in order to have the ability to form a uniform silicon monolayer. To maintain the benefit of the electrical properties and prevent excess nitrogen from diffusing into the substrate 101, the thickness of the silicon layer 104 is about one-quarter (0.25) to one-half (0.5) of the thickness of the dielectric layer 102. Accordingly, in an embodiment such as that discussed above in which the dielectric layer 102 is about 4 Å to about 18 Å, the thickness of the silicon layer 104 is about 1 Å to about 10 Å, but preferably from about 2 Å to about 6 Å. For another example, if the thickness of the final gate dielectric is 10 Å, the thickness of the dielectric layer 102 is about 7 Å and the thickness of the silicon layer 104 is about 3 Å. It has been found that thicknesses such as these maintain the benefit of the electrical properties and prevent excess nitrogen from diffusing to the substrate/dielectric interface 103.

Figure 1C:
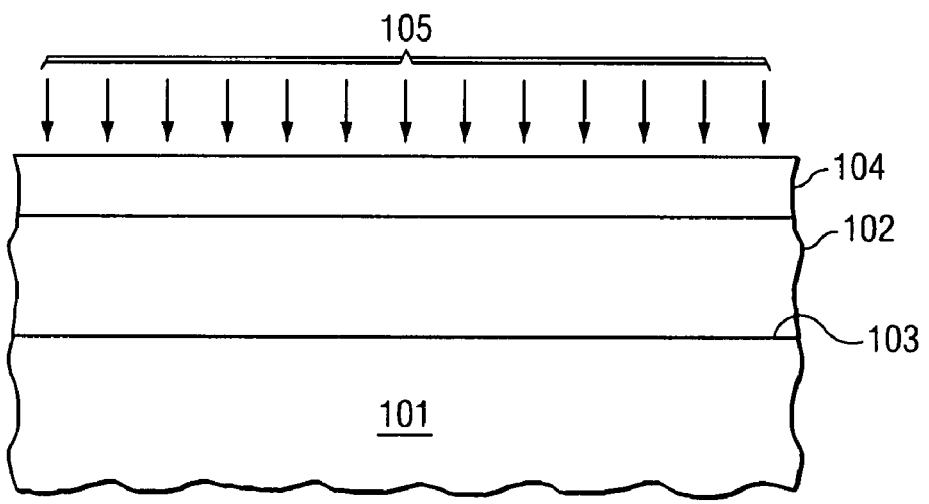
Figure 1D:
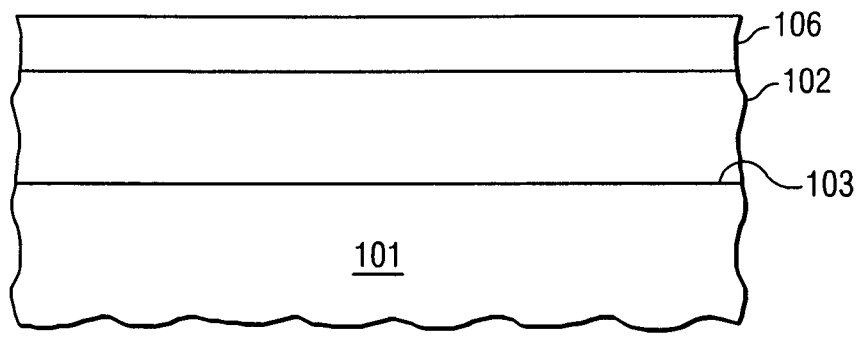

As shown in FIG. 1C, the silicon layer 104 is treated to form a barrier layer 106 (shown in FIG. 1D). This treatment could use nitrogen, molecules that include nitrogen (such as ammonia), an inert gas (such as xenon or helium), or other material such that the barrier layer exhibits the appropriate characteristics such as a high dielectric constant. In an embodiment nitrogen 105 is introduced into the silicon layer 104 by plasma treatment (e.g., ammonia plasma), thermal treatment (e.g., ammonia gas), plasma ion immersion (PII), ion implantation, or the like as illustrated in FIG. 1C.

For example, the silicon layer 104 can be exposed to a nitrogen-containing ambient (such as ammonia gas) at a temperature of about 300° C. to about 1,000° C. with or without the presence of plasma. In an embodiment in which the dielectric layer 102 is silicon oxide, the energy that is required to break the Si-O bonds in the dielectric layer 102 is higher than the energy required to break the Si-Si bonds in the silicon layer 104, and the nitrogen 105 will selectively react with the silicon atoms in the silicon layer 104 to form a silicon nitride layer 106, rather than reacting with the silicon atoms in the dielectric layer 102. In addition to this selective reaction, the silicon nitride layer 106 is more stable than the nitridation of silicon oxide. Accordingly, the nitrogen 105 will be substantially confined in the resulting silicon nitride layer 106 and the phenomenon of nitrogen diffusing through the dielectric layer 102 and into the substrate 101 is reduced and/or eliminated, thereby limiting the charge effect at the interface of the dielectric layer 102 and the substrate 101.

Figure 3:
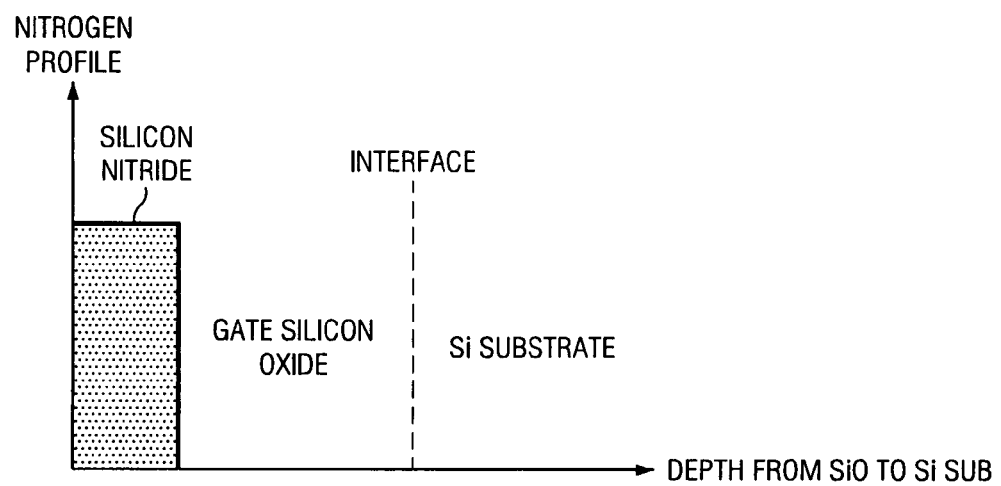
FIG. 3 is a graph illustrating a nitrogen diffusion profile in an embodiment of the present invention.

The resulting structure of this treatment is shown in FIG. 1D. As in FIGS. 1A-1C, the dielectric layer 102 overlies the substrate 101. Overlying the dielectric layer 102 is a silicon nitride layer 106 that acts as a barrier layer to prevent diffusion into the substrate 101. In an embodiment, the nitrogen profile throughout the entire structure will be substantially a step-form as shown in FIG. 3.

Optionally, an annealing process could be performed after the treatment process to repair any damage caused during the conversion process described above. However, while rapid thermal annealing is a common technique used to anneal, the thermal energy used also causes further diffusion of materials through the layers, and could even cause some contamination of the substrate 101. Accordingly, while thermal annealing can be utilized, other rapid annealing techniques such as flash anneal or laser anneal are preferentially used.

Figure 1E:
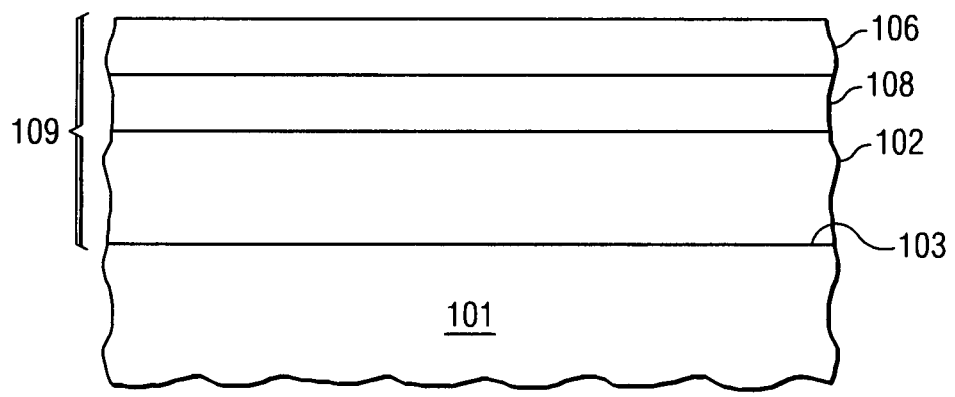

In another embodiment whose result is shown in FIG. 1E, in a continuous process nitrogen 105 is diffused into both the silicon layer 104 and a portion of the dielectric layer 102. This silicon nitride layer 106, which is formed prior to the nitrogen 105 diffusing into the dielectric layer 102, acts as a barrier and slows down the nitrogen diffusion. This slowing can be utilized for better control of the nitrogen's 105 diffusion beyond the now formed silicon nitride layer 106. With better control of the diffusion, a small amount of nitrogen 105 may be selectively diffused into the dielectric layer 102, thereby converting the upper portion of the dielectric layer 102 into a silicon oxynitride layer 108.

For example, nitrogen is introduced into both the silicon layer 104 and into portions of the dielectric layer 102 (in this example silicon oxide) to form a nitridized silicon oxide layer 108 beneath a silicon nitride layer 106. The nitrogen can be introduced using thermal treatment, plasma treatment, plasma ion immersion, or ion implantation. For example, in an embodiment of the invention as discussed above in which the dielectric layer 102 is initially formed to a thickness of about 7 Å, if the thickness of the nitridized silicon oxide layer 108 is formed to about 3 Å, the unreacted silicon oxide layer 102 that remains would be about 4 Å thick. This would form a final gate dielectric 109 comprising a silicon oxide layer 102 about 4 Å thick combined with a nitridized silicon oxide layer 108 about 3 Å thick and a silicon nitride 106 layer about 3 Å thick. The final gate dielectric 109, comprising an oxide layer 102, a silicon oxynitride layer 108, and a silicon nitride layer 106, would include more nitride than an oxide gate, thereby improving the performance of the gate dielectric layer.

Figure 1F:
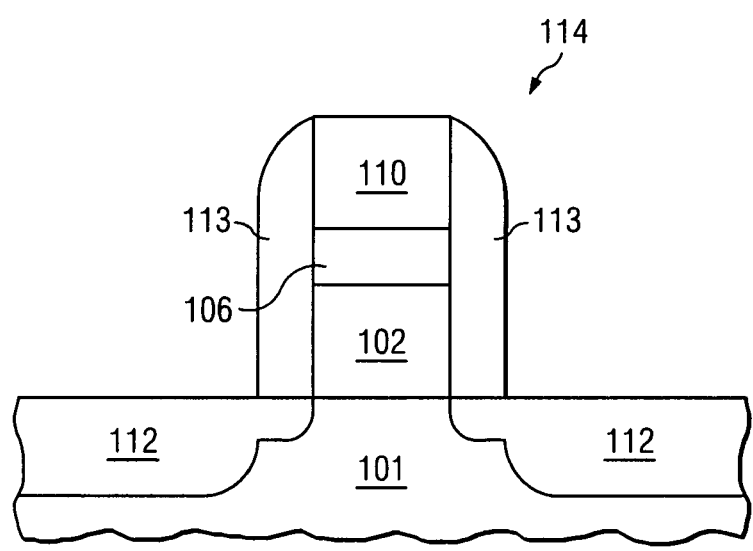
Figure 2:
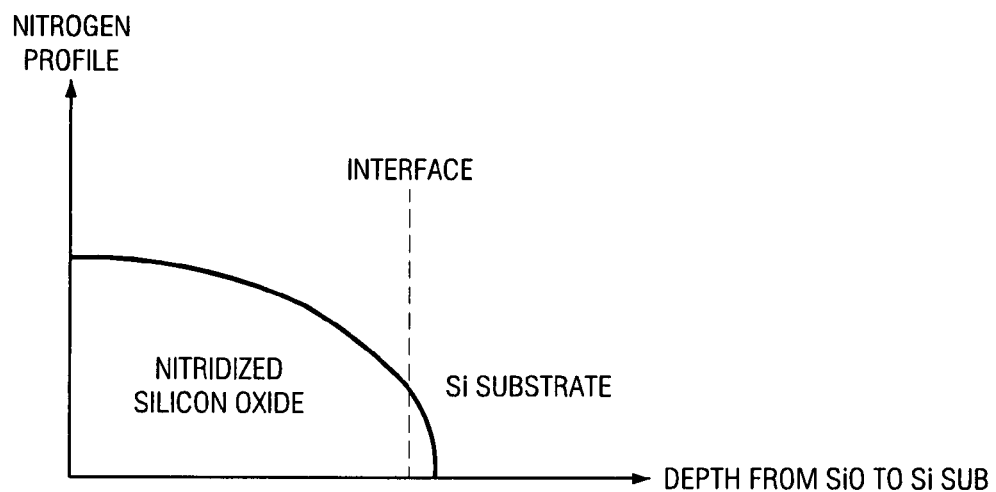
FIG. 2 is a graph illustrating a profile of nitrogen diffusion in a nitridized silicon oxide dielectric layer showing nitrogen diffusion near the substrate/gate oxide interface in the prior art.

As shown in FIG. 1F, the process described above may be used to form a MOSFET transistor 114 through the addition of a polysilicon or metal gate electrode 110, source drain regions 112, and spacers 113. These could all be added through methods well known in the art.

Although the present invention and its advantages have been described in detail, it should be understood that various changes, substitutions and alterations can be made herein without departing from the spirit and scope of the invention as defined by the appended claims. For example, there are multiple methods for the deposition of material as the structure is being formed. Any of these deposition methods that achieve substantially the same result as the corresponding embodiments described herein may be utilized according to the present invention.

Moreover, the scope of the present application is not intended to be limited to the particular embodiments of the methods described in the specification. As one of ordinary skill in the art will readily appreciate from the disclosure of the present invention, methods presently existing, or later to be developed, that perform substantially the same function or achieve substantially the same result as the corresponding embodiments described herein may be utilized according to the present invention. Accordingly, the appended claims are intended to include within their scope such methods.

What is claimed is:

1. A method for making a metal-oxide semiconductor field effect transistor, the method comprising:
    forming a dielectric layer on a semiconductor substrate;
    forming a silicon layer onto the dielectric layer, the forming the silicon layer being performed at least in part with an atomic layer deposition process;
    treating all of the formed silicon layer with molecular nitrogen or ammonia, to form an oxygen-free barrier layer;
    converting a portion of the dielectric layer into a first layer, the first layer being located between a remaining portion of the dielectric layer and the barrier layer, wherein the first layer is silicon oxynitride;
    forming a gate electrode;
    forming source and drain regions; and
    forming spacers alongside the gate electrode.

2. The method of claim 1, further comprising annealing the dielectric layer using a rapid thermal anneal, flash anneal, or laser anneal.

3. A method for making a semiconductor device, comprising:
    forming a dielectric layer on a semiconductor substrate;
    forming a silicon layer onto the dielectric layer, the silicon layer being free from oxygen, wherein forming the silicon layer begins after completely forming the dielectric layer;
    treating the silicon layer with a first material to form a non-oxidized first layer, the first material being non-plasma molecular nitrogen; and
    converting a portion of the dielectric layer into a second layer, the second layer being silicon oxynitride and being located between a remaining portion of the dielectric layer and the first layer.

4. The method of claim 3, wherein the dielectric layer has a thickness of between about 4 Å and about 18 Å.

5. The method of claim 3, wherein the silicon layer has a thickness of between about 1 Å and about 10 Å.

6. The method of claim 3, wherein the dielectric layer is silicon oxide.

7. The method of claim 3, wherein the treating is performed at least in part by plasma treatment, thermal treatment, plasma ion immersion, or ion implantation.

8. The method of claim 3, wherein the first layer is silicon nitride.

9. The method of claim 3, wherein the first material comprises nitrogen.

10. A method for making a semiconductor structure, the method comprising:
    forming a dielectric layer on a semiconductor substrate, wherein the dielectric layer is silicon oxide;
    forming a silicon layer onto the dielectric layer, the silicon layer having a smaller thickness than the dielectric layer;
    treating substantially all of the silicon layer with a first material to form a first layer while maintaining at least a portion of the dielectric layer, the first layer having a constant concentration of a first component of the first material and the semiconductor structure having a step-form profile of the first material; and
    forming a gate electrode in physical contact with the first layer.

11. The method of claim 1, wherein the dielectric layer has a thickness of between about 4 Å and about 18 Å.

12. The method of claim 1, wherein the silicon layer has a thickness of between about 1 Å and about 10 Å.

13. The method of claim 1, wherein the treating is performed at least in part by a plasma treatment, thermal treatment, plasma ion immersion, or ion implantation.

14. The method of claim 1, wherein the first layer is silicon nitride.

15. The method of claim 1, wherein the first material comprises nitrogen.

16. The method of claim 1, further comprising forming a gate electrode overlying the first layer.

17. The method of claim 1, further comprising annealing the dielectric layer using a rapid thermal anneal, flash anneal, or laser anneal.

* * * * *